(12) United States Patent
Fischer

(10) Patent No.: US 6,535,534 B1
(45) Date of Patent: Mar. 18, 2003

(54) OPTICAL SOURCE DRIVER WITH BIAS CIRCUIT FOR CONTROLLING OUTPUT OVERSHOOT

(75) Inventor: Jonathan H. Fischer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/949,592

(22) Filed: Sep. 10, 2001

(51) Int. Cl.[7] ................................................. H01S 3/00
(52) U.S. Cl. ................................. 372/38.07; 372/38.02
(58) Field of Search ............................. 372/38.02, 38.07

(56) References Cited

U.S. PATENT DOCUMENTS 5,883,910 A * 3/1999 Link ........................ 372/38.07
5,955,929 A * 9/1999 Moon et al. .................. 331/57

* cited by examiner

Primary Examiner—Paul Ip
Assistant Examiner—Dung Nguyen
(74) Attorney, Agent, or Firm—Ryan, Mason & Lewis, LLP

(57) ABSTRACT

A driver circuit for a laser diode or other optical source includes a differential circuit having first and second inputs for receiving differential input data, a current generator circuit for generating modulation current for the optical source in response to the input data, and a variable bias circuit for applying a variable bias to the differential circuit. The current generator is preferably adapted to establish the modulation current for application to one of a first output and a second output of the driver circuit in accordance with the differential data applied to the first and second inputs of the differential circuit. The variable bias circuit may be configured such that the variable bias current generated thereby for application to the differential circuit is a function of the modulation current, thereby controlling an output overshoot of the driver circuit.

17 Claims, 6 Drawing Sheets

OPTICAL SOURCE DRIVER WITH BIAS CIRCUIT FOR CONTROLLING OUTPUT OVERSHOOT

FIELD OF THE INVENTION

The present invention relates generally to circuits for supplying drive current to lasers or other optical sources, and more particularly to bias control circuits for use in an output stage of a laser driver or other optical source driver.

BACKGROUND OF THE INVENTION

Laser diodes and other types of semiconductor lasers are in widespread use as optical sources in high-speed optical data transmission applications. Laser diodes are particularly desirable in such applications due to their high optical output power and spectral purity. A laser driver circuit, also referred to herein as simply a "driver," is used to supply appropriate drive current to a semiconductor laser, so as to control the optical output signal between an "on" state corresponding to a logic one level and an "off" state corresponding to a logic zero level, in accordance with the data to be transmitted.

Conventional semiconductor laser driver circuits are described in U.S. Pat. No. 5,883,910, issued Mar. 16, 1999 in the name of inventor G. N. Link and entitled "High Speed Semiconductor Laser Driver Circuits," which is incorporated by reference herein.

In order to optimize the performance of a semiconductor laser based optical system, it is important to precisely control the drive to the semiconductor laser. More particularly, it is generally desirable to minimize the overshoot in the drive signal when the semiconductor laser is driven from the off state to the on state. Significant overshoot can cause automatic gain control (AGC) circuitry in a receiver of the optical system to implement a substantial reduction in the receiver gain, thereby unnecessarily attenuating the desired signal. This will degrade signal-to-noise performance and increase bit error rate, while reducing the distance over which the optical signal can be transmitted at a given quality level. Typically, a maximum acceptable driver output overshoot is no more than about 10% of the average peak-to-peak output signal amplitude.

A significant problem with conventional semiconductor laser driver circuits such as those described in the above-cited U.S. Pat. No. 5,883,910 is that such circuits can cause a driver output signal to exhibit an overshoot which may exceed the above-noted maximum acceptable levels.

A need therefore exists for improved driver circuits, for use with semiconductor lasers and other optical sources, which are configured to limit the overshoot of the driver output signal to acceptable levels.

SUMMARY OF THE INVENTION

The invention provides improved optical source driver circuits which meet the above-noted need.

In accordance with one aspect of the invention, a driver circuit for a laser diode or other optical source includes a differential circuit having first and second inputs for receiving differential input data, a current generator circuit for generating modulation current for the optical source in response to the input data, and a variable bias circuit for applying a variable bias to the differential circuit. The current generator is preferably adapted to establish the modulation current for application to one of a first output and a second output of the driver circuit in accordance with the differential data applied to the first and second inputs of the differential circuit. The variable bias circuit may be configured such that the variable bias current generated thereby for application to the differential circuit is a function of the modulation current, thereby controlling an output overshoot of the driver circuit.

Advantageously, the invention can significantly reduce the output overshoot of an optical source driver circuit, e.g., to a level below the previously-mentioned 10% maximum acceptable level, without adversely impacting other performance parameters of the circuit.

DETAILED DESCRIPTION OF THE INVENTION

The present invention will be illustrated herein using exemplary semiconductor laser driver circuits. It should be understood, however, that the particular circuits shown are by way of illustrative example only, and the techniques of the invention are more generally applicable to a wide variety of other optical source drivers. Moreover, although illustrated using a laser diode optical source, the invention can of course be utilized with other types of optical sources.

The general operating characteristics of an illustrative embodiment of the invention will initially be described with reference to the simplified diagrams of FIGS. 1 and 2. More detailed schematic diagrams showing the particular type of bias control utilized in the illustrative embodiment will be described in conjunction with FIGS. 3 and 6.

Figure 1:
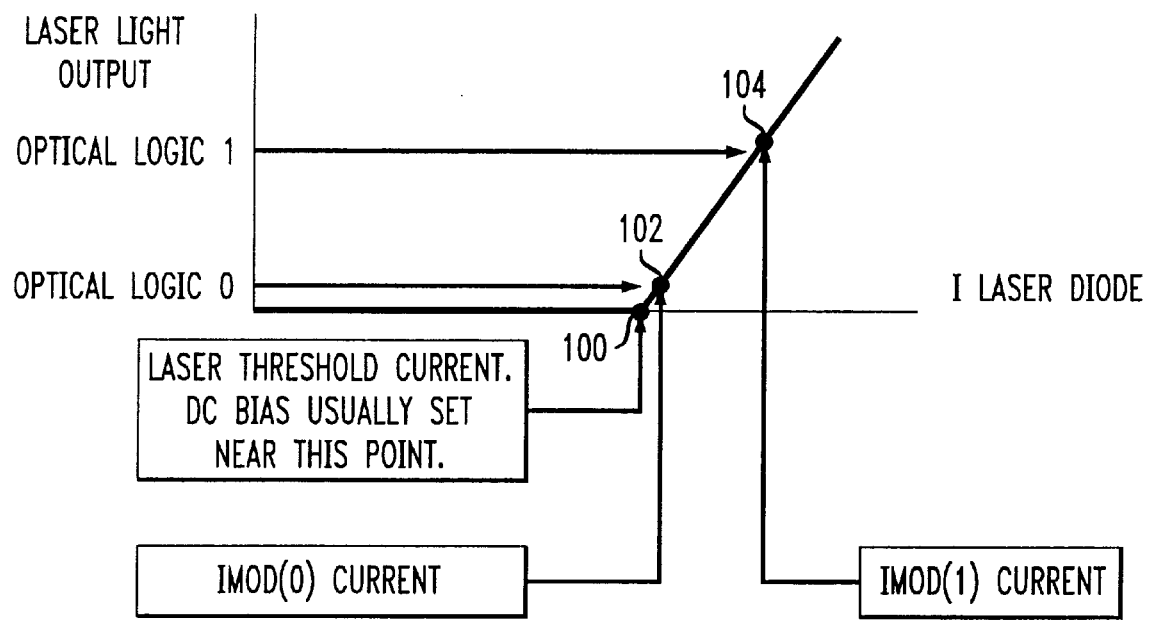
FIG. 1 is a plot of laser diode output as a function of drive current in an illustrative embodiment of the invention.

FIG. 1 shows laser diode light output as a function of diode current in an illustrative embodiment of the invention. Point 100 on the plotted output characteristic corresponds to the laser threshold current. This is the point at which further increases in current will generate laser light output. It is generally desirable in high-speed optical data transmission applications for the direct current (DC) bias of the laser diode to be set at or near this point. Points 102 and 104 on the plotted characteristic correspond to respective low and high modulation current levels IMOD(0) and IMOD(1). These current levels are associated with generation of an optical logic zero output and an optical logic one output, respectively. It is assumed for simplicity and clarity of description that a high level optical output is a logic one and a low level optical output is a logic zero, although it is to be appreciated that this is not a requirement of the invention.

It should also be noted that the particular output characteristic as shown in FIG. 1 is illustrative only, and the invention can be used with optical sources having other types of output characteristics.

Figure 2:
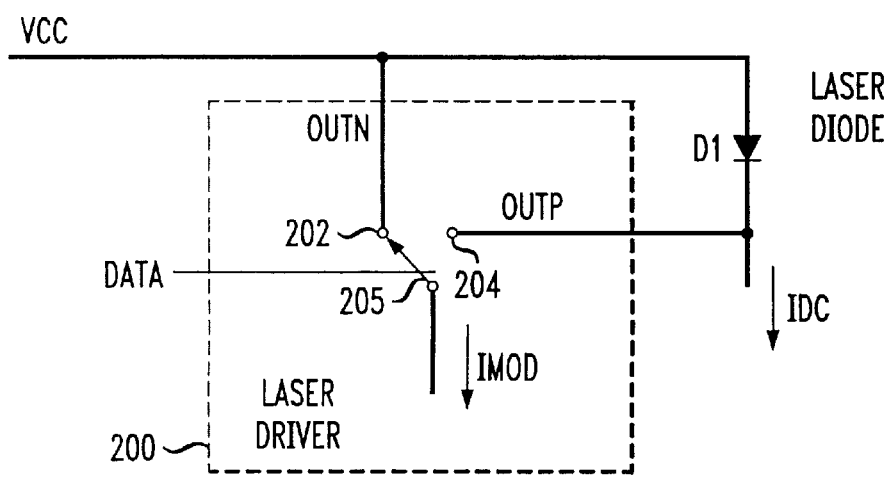
FIG. 2 shows a simplified diagram of a laser diode optical source and an associated laser driver circuit in which the present invention is implemented.

FIG. 2 shows a portion of an optical system transmitter in accordance with the invention. The portion of the transmitter as shown includes a laser driver circuit 200 and a laser diode D1. A DC bias current IDC is applied to the laser diode D1 as indicated by an associated DC bias circuit (not shown). The laser driver circuit 200 includes a data input and positive and negative outputs denoted OUTN (terminal 202) and OUTP (terminal 204), respectively. The applied data in this simplified diagram serves to control the position of switch 205 such that the low modulation current IMOD(0) is applied to the laser diode D1 when the data is at a logic low level, and the high modulation current IMOD(1) is applied to the laser diode D1 when the data is at a logic high level. This occurs through direction of the modulation current IMOD via switch 205 and the OUTN terminal 202 to supply voltage VCC when the input data is at a logic low level, and via switch 205 and the OUTP terminal 204 to the anode of laser diode D1 when the input data is at a logic high level.

The description herein assumes that the IMOD(0) and IMOD(1) levels as shown in FIG. 1 are normalized to the applied DC bias current, such that when IMOD(0) or IMOD(1) is indicated as being applied to the laser diode D1, the total applied current is the sum of the DC bias current IDC and the particular modulation current IMOD(0) or IMOD(1). It should be noted that the IMOD(0) current may be zero, i.e., points 100 and 102 in FIG. 1 may be the same, such that the applied current in this case is only the DC bias current IDC.

The laser driver 200 is particularly well-suited for use in an optical system that includes multiple laser driver modules, each supplying drive current for a corresponding laser diode. In such an application, there may be significant advantages in minimizing the overall system power in order to allow higher integration. One possible technique is to configure a given laser driver module so as to drive the corresponding laser diode with just enough current to meet the system optical power specification. When the laser diode is new, little current is needed to meet this specification. However, as the laser diode ages, more current is needed. To handle expected production variation and laser diode aging, the above-described modulation current (IMOD) may be specified, e.g., over a 12:1 range (such as 5 mA to 60 mA). The system may also require a particular ratio of the "on" state current (Ion) to "off" state current (Ioff) for the laser diode, e.g., an Ion:Ioff ratio of 10:1 or greater. With reference to FIG. 1, the laser diode D1 is considered to be in the on state upon application of the high modulation current IMOD(1) and in the off state upon application of the low modulation current IMOD(0).

Figure 3:
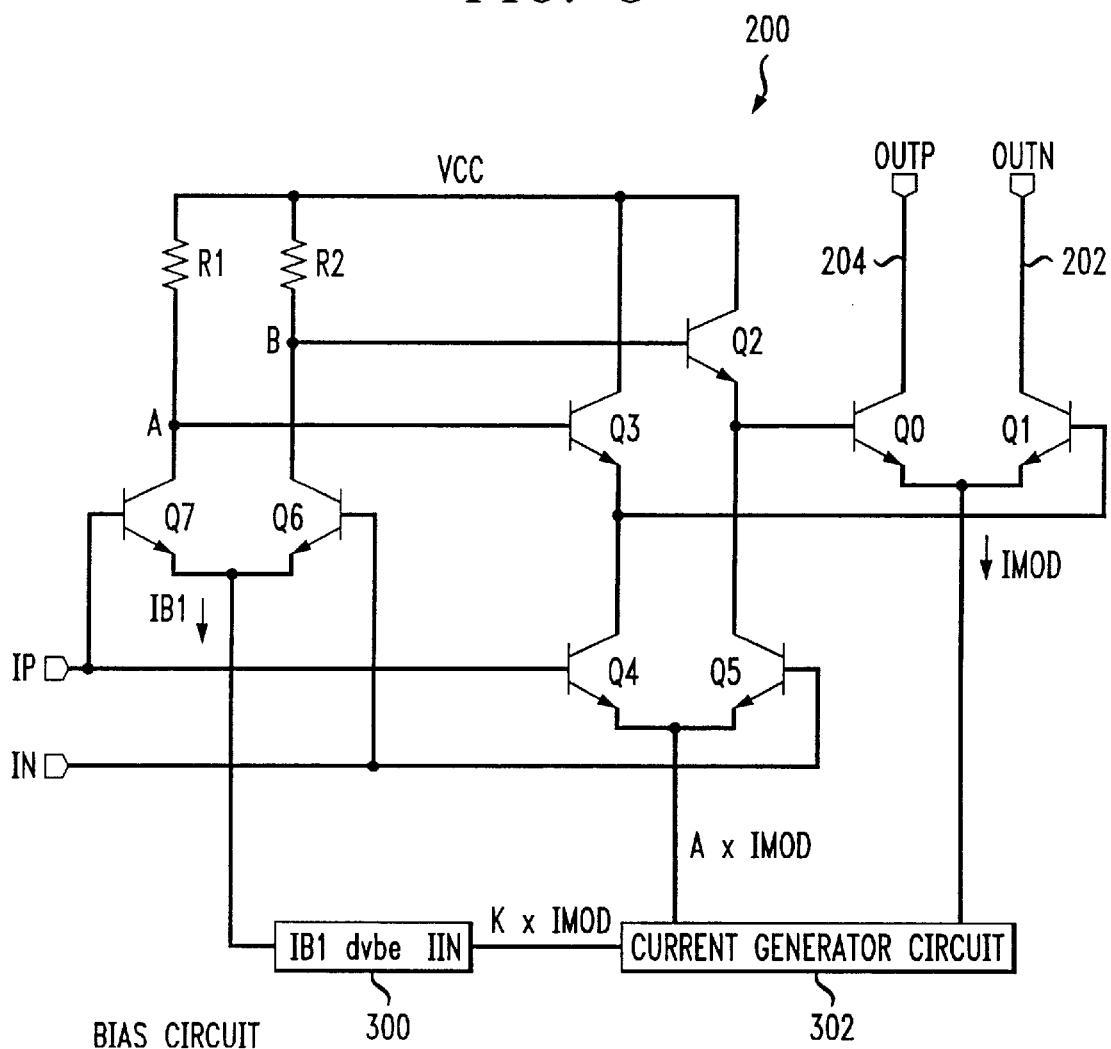
FIG. 3 is a schematic diagram of the laser driver of FIG. 2.

FIG. 3 shows a more detailed view of one possible implementation of the laser driver 200 of FIG. 2 in accordance with the invention. The laser driver 200 as shown includes a differential base-emitter voltage (dVbe) bias circuit 300, a current generator circuit 302, an output stage differential pair comprising transistors Q0 and Q1, a push-pull stage comprising transistors Q2 through Q5, and an input stage differential pair comprising transistors Q6 and Q7. The top half (Q2, Q3) of the push-pull stage (Q2–Q5) drives the output stage differential pair (Q0, Q1), while the bottom half (Q4, Q5) of the push-pull stage is driven directly by differential data inputs IP and IN. The differential data inputs also drive the input stage differential pair (Q6, Q7). The output stage differential pair corresponds generally to switch 205 of FIG. 2.

The current generator circuit 302 generates the modulation current IMOD that is applied via one of the transistors Q0 or Q1 of the output stage differential pair to respective output terminal OUTP 204 or OUTN 202, in accordance with the differential data inputs. The current generator circuit 302 also generates a first scaled modulation current A×IMOD for application as a bias current to the differential pair Q4, Q5, and a second scaled modulation current K×IMOD for application to an IIN input of the dVbe bias circuit 300. The dvbe bias circuit 300 utilizes the scaled modulation current K×IMOD to generate a bias current IB1 for application to a common emitter terminal of the input stage differential pair Q6, Q7.

Example values for the above-noted scaling factors A and K in the FIG. 3 laser driver are 0.11 and $2.1 \times 10^{-1}$, respectively. Other values can also be used, as will be appreciated by those skilled in the art. The IMOD current and the first and second scaled versions thereof may be generated in a straightforward manner in the current generator circuit 302, using well-known techniques. The term "current generator circuit" as used herein is intended to include a single circuit which generates each of the above-noted currents, as well as portions or combinations of multiple circuits each of which generates a particular one of the currents.

The differential data applied to the input terminals IP and IN may comprise, e.g., approximately 200 to 300 mV peak differential logic signals, such that the differential pairs Q6, Q7 and Q4, Q5 each switch their corresponding bias current to one side of the pair or the other.

The FIG. 3 circuit further includes resistors R1 and R2 coupled between respective collector terminals of the input differential pair transistors Q7 and Q6 and the supply voltage VCC. These transistors may be configured as 220 ohm resistors, although other values could also be used.

The effects of bias current and applied drive voltage on a differential pair will now be described in greater detail.

For ideal bipolar transistors, the collector current (Ic) and base-emitter voltage (Vbe) relationship in forward bias is $$Ic = Is \times e^{**}(Vbe/Vt),$$

where Is is the reverse saturation current and Vt is the thermal voltage. The thermal voltage Vt is 26 mV at room temperature, and is given by $$Vt = kT/q,$$

where k is Boltzmann's constant, q is the charge on an electron, and T is absolute temperature in degrees Kelvin. Additional details can be found in A. B. Grebene, "Bipolar and CMOS Analog Integrated Circuit Design," John Wiley & Sons, 1984, ISBN 0-471-08529-4, which is incorporated by reference herein. The base-emitter voltage Vbe for a given current is $$Vbe = Vt \ln(Ic/Is).$$

The difference between the base-emitter voltages for identical transistors operating at different collector currents is $$dVbe = Vt\ \ln(Ic1/Is) - Vt\ \ln(Ic2/Is) = Vt\ \ln(Ic1/Ic2).$$

For a 10:1 current ratio (Ic1=10×Ic2), $$dVbe = Vt\ \ln(10) = 60\ \text{mV at room temperature}.$$

Therefore, in theory, the differential drive across the base-emitter junctions of transistors Q0 and Q1 in the output stage differential pair of FIG. 3 need only be 60 mV at a 25° C. junction temperature. However, this drive needs to scale with absolute temperature (the Vt term above) while also being independent of bias current.

Figure 4:
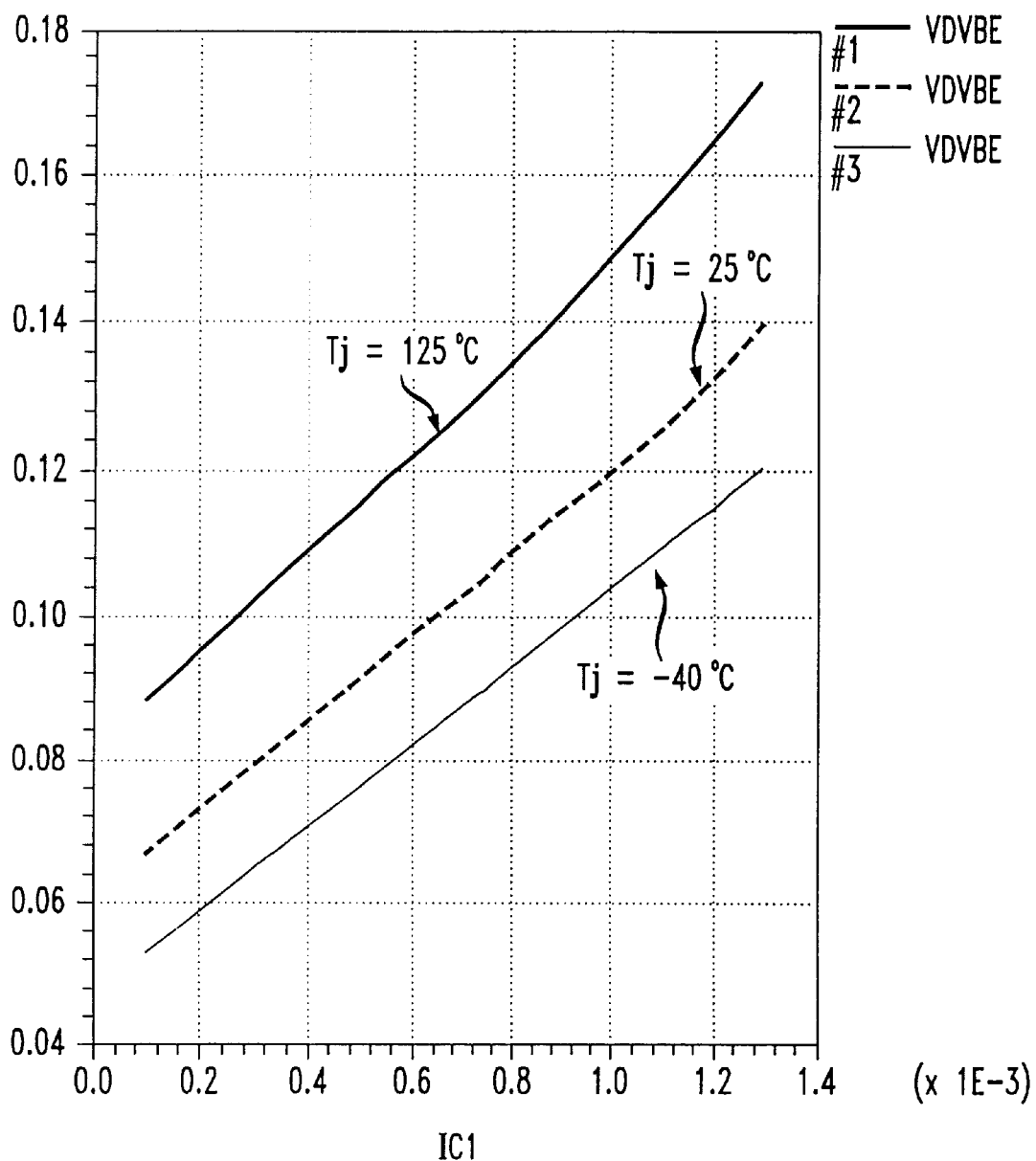
FIG. 4 is a plot of output stage differential base-emitter voltage (dvbe) as a function of bias current for different temperature levels in the FIG. 3 laser driver.

FIG. 4 illustrates that non-ideal effects can cause the output stage drive to be bias current dependent. The figure plots dVbe voltage as a function of the current Ic1 for three different junction temperatures, i.e., Tj=125° C., Tj=25° C. (room temperature), and Tj=−40° C. It can be seen that the output stage drive (dVbe) varies as a function of the current Ic1. If the transistors were ideal, each of the dVbe responses shown in the figure would have been parallel to the horizontal (Ic1) axis. It is possible to address this dependence of drive on bias current and temperature by setting the output swing of the input stage Q6, Q7 differential pair (IB1×R1) to be large enough for the full IMOD range and vary it only with temperature. However, this approach can lead to excessive overshoot of the type previously described herein, as will be illustrated in FIG. 5.

Figure 5:
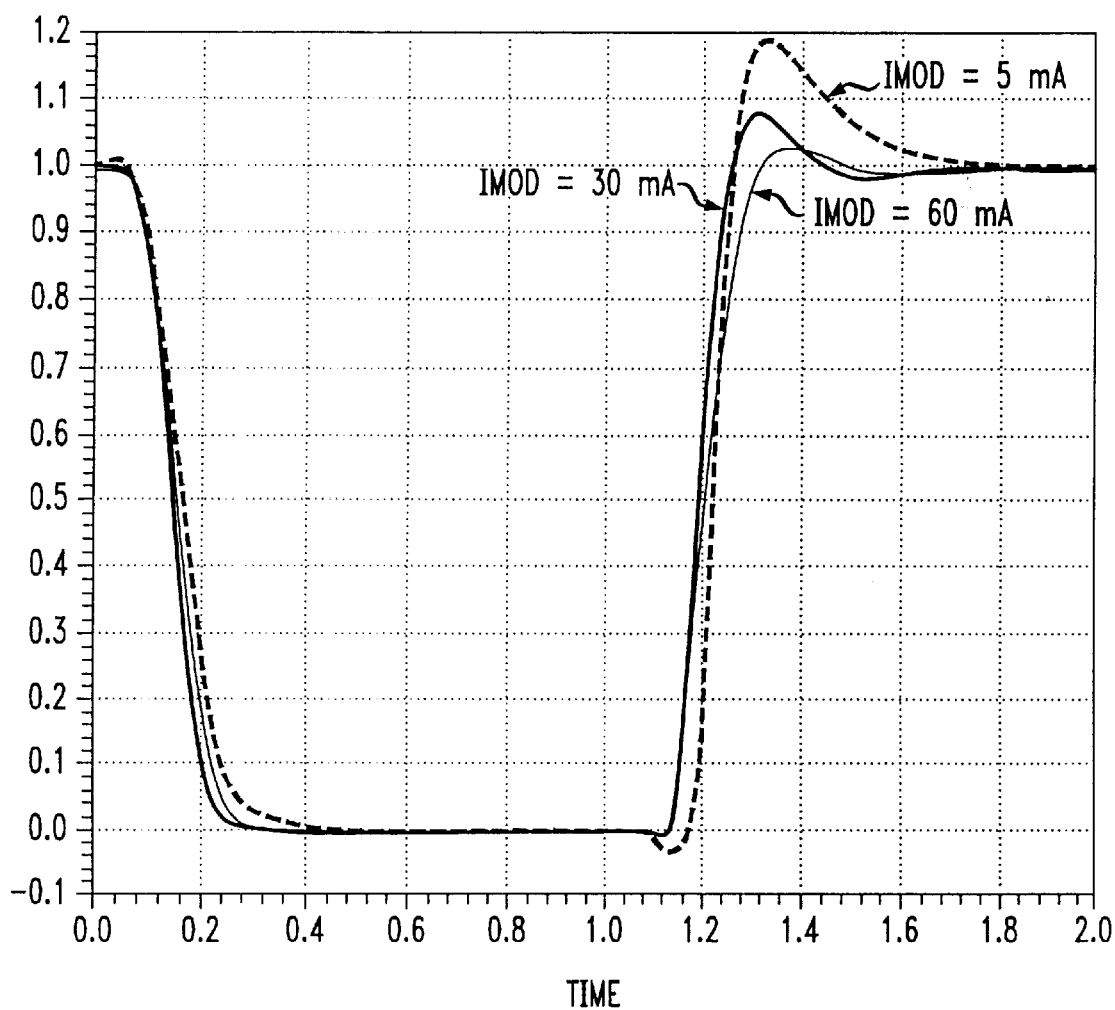
FIG. 5 shows laser driver output as a function of time for different modulation current levels and a fixed bias current for an input stage differential pair, illustrating an overshoot problem that is alleviated by the techniques of the present invention.

FIG. 5 shows the laser drive response (output drive current as a function of time) for a fixed junction temperature when IMOD is varied from 5 to 60 mA with the bias to the Q6, Q7 differential pair fixed at the bias needed for proper operation when IMOD=60 mA. The plotted curves, shown for IMOD=5 mA, IMOD=30 mA and IMOD=60 mA, have been normalized such that 1.0 represents the intended output current for driving the laser diode to the on state and 0.0 represents the intended output current for driving the laser diode to the off state. It can be seen from the FIG. that an overshoot of about 20% results when IMOD=5 mA. The overshoot is the result of overdriving the differential output stage at low bias currents.

In accordance with the invention, the overshoot of the laser driver 200 is controlled by adjusting the bias current IB1 applied to the Q6, Q7 differential input stage so that this input stage drives the top half (Q2, Q3) of the push-pull stage (Q2–Q5) in a manner that avoids overdriving the differential output stage as IMOD is varied. The bias current IB1 also preferably tracks absolute temperature to match the output stage transistor parameter variations. The above-described adjustments in the bias current IB1 are provided by the dVbe bias circuit 300.

Figure 6:
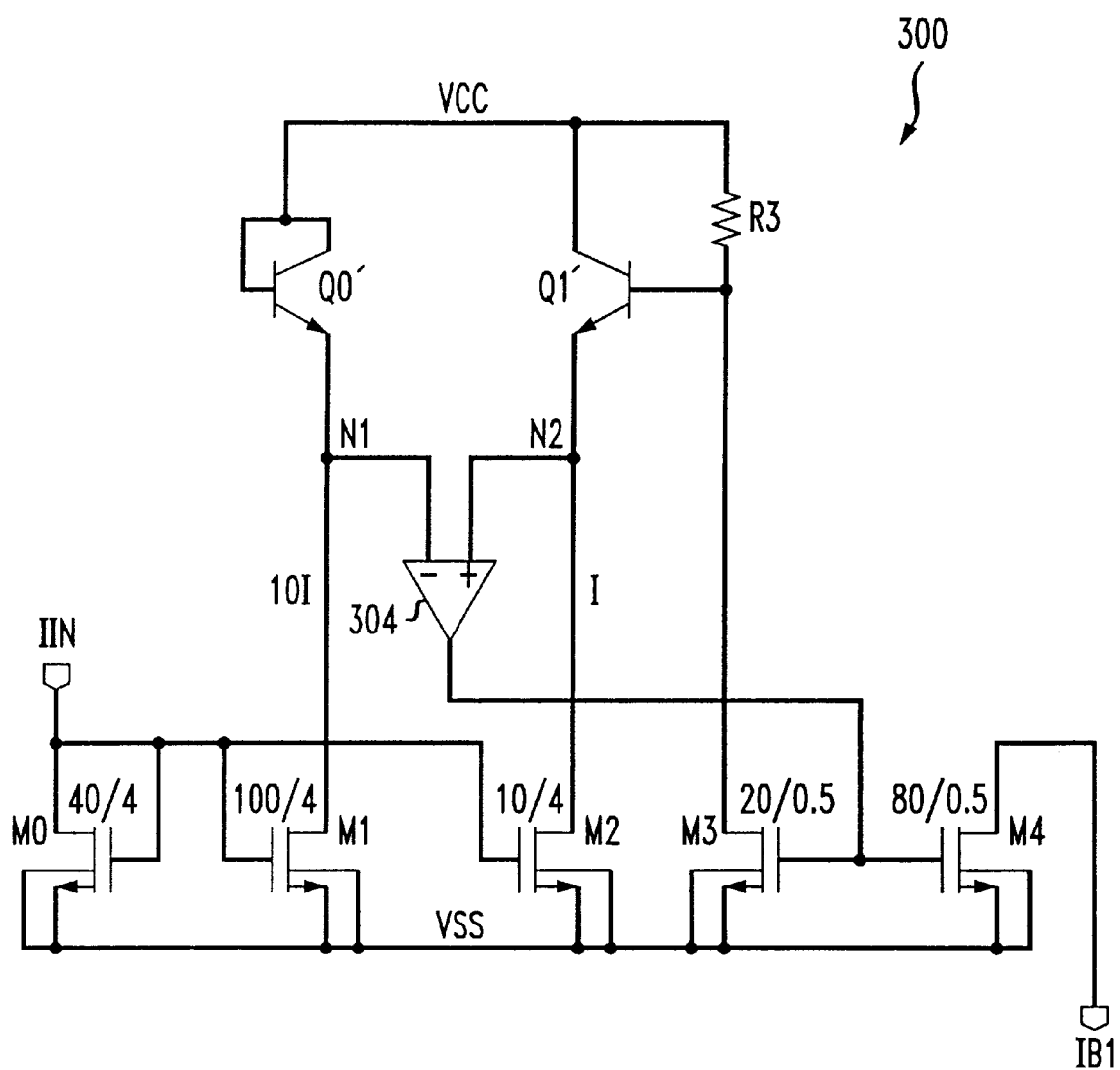
FIG. 6 is a schematic diagram of a dVbe bias circuit for use in the FIG. 3 laser driver in accordance with the present invention.

FIG. 6 shows one possible implementation of the dVbe bias circuit 300 in accordance with the invention. Transistors Q0' and Q1' serve to model or characterize the output stage differential devices Q0 and Q1 in the laser driver 200 of FIG. 3. The dvbe bias circuit further includes Metal-oxide-semiconductor (MOS) devices M0, M1, M2, M3 and M4 arranged as shown. Source terminals of these devices are coupled to a supply voltage VSS. Devices M1 and M2 are configured to provide currents I and 10I which differ by a factor of 10. A differential amplifier 304 forces nodes N1 and N2 to be equal by adjusting the current in device M3 to set the voltage across resistor R3 to be the difference between the base-emitter voltages of Q0' and Q1', so as to generate a voltage proportional to absolute temperature (VPTAT).

The MOS devices M0, M1, M2, M3 and M4 may have width/length dimensions of 40/4, 100/4, 10/4, 20/0.5 and 80/0.5, respectively, all in micrometers ($\mu$m). These dimensions are examples only, and not requirements of the invention.

In accordance with the invention, the above-noted scaled version of IMOD (K×IMOD) drives device M0 and sets the current in devices M1 and M2. Biasing these reference transistors with the scaled version of IMOD causes the bias dependence to be included in the difference in base-emitter voltage (dVbe) as generated across R3. The voltage across R3 sets the voltage across R1 and R2 in the laser driver 200 of FIG. 3 by setting the Q6, Q7 differential pair bias current IB1. The resistor R3 is preferably of the same type and width as resistors R1 and R2, such that resistor process and temperature variation cancels out. In this embodiment, R3 may be selected as 1 kohm, although other values can be used, as will be appreciated by those skilled in the art.

Figure 7:
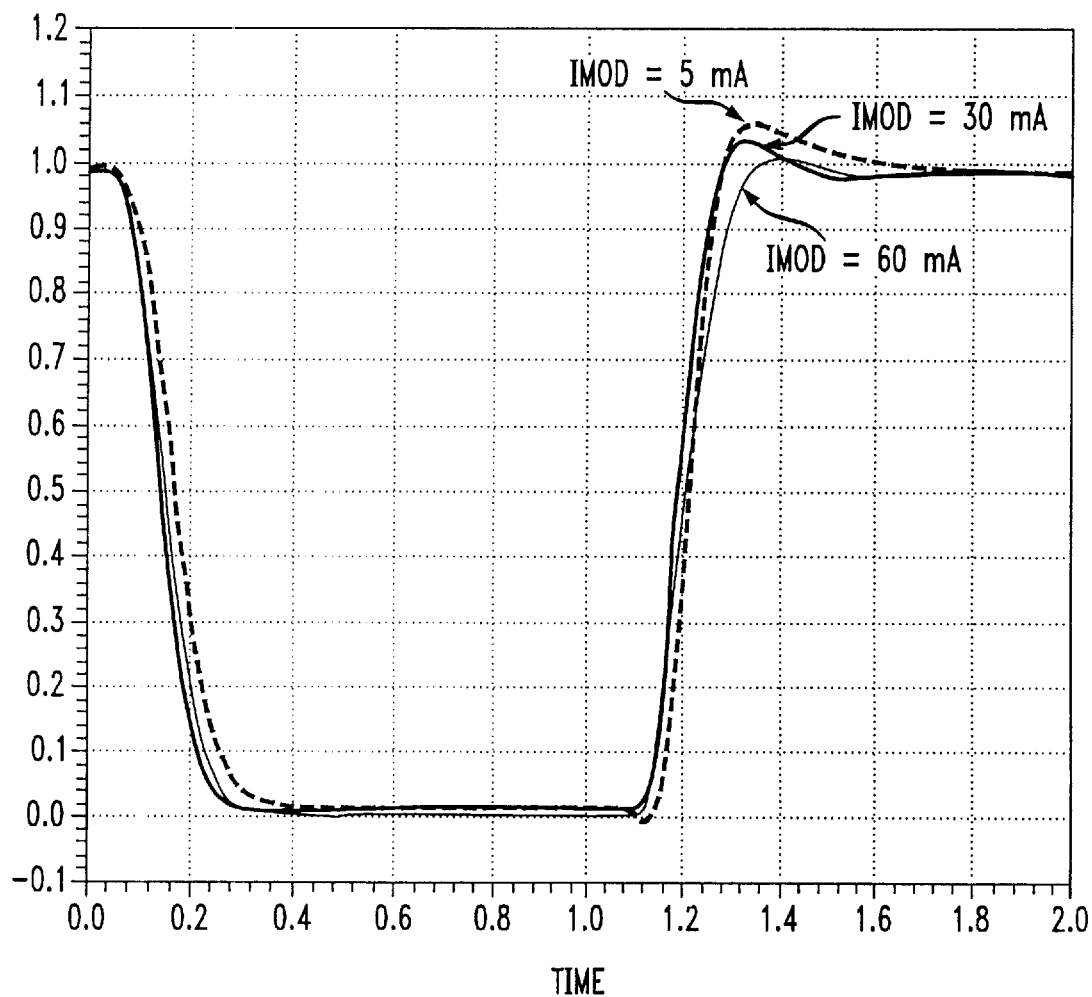
FIG. 7 shows laser driver output as a function of time for different modulation current levels utilizing for an input stage differential pair a variable bias generated by the bias circuit of FIG. 6, illustrating a reduction in overshoot achieved using the techniques of the present invention.

FIG. 7 shows the laser driver response using the dVbe bias circuit 300 of FIG. 6 rather than the fixed bias used in the case of FIG. 5. Again, IMOD is varied from 5 to 60 mA, and the plotted curves, shown for IMOD=5 mA, IMOD=30 mA and IMOD=60 mA, have been normalized such that 1.0 represents the intended output current for driving the laser diode to the on state and 0.0 represents the intended output current for driving the laser diode to the off state. It can be seen from the figure that the overshoot, which was about 20% in the fixed bias case of FIG. 5, has been substantially reduced to a level of less than about 10% through the use of the variable bias circuit 300 of FIG. 6. The FIG. 6 bias circuit thus operates to prevent the overdriving of the differential output stage at low bias currents.

The particular embodiments of the invention as described herein are intended to be illustrative only. For example, as previously indicated, different device types and transistor technologies may be used in other embodiments. In addition, although illustrated using multiple differential circuits, the invention can also be implemented using one or more single-ended circuits. In such an embodiment, a single-ended input data signal applied to the driver circuit may be converted to a differential data signal within the driver circuit. These and numerous other alternative embodiments within the scope of the following claims will be readily apparent to those skilled in the art.

What is claimed is:

1. A driver circuit for an optical source, the driver circuit comprising:

a differential circuit having first and second inputs;

a current generator circuit adapted to establish a modulation current for application to one of a first output and a second output of the driver circuit in accordance with differential data applied to the first and second inputs of the differential circuit; and a variable bias circuit having an input coupled to a bias current output of the current generator circuit and an input coupled to a bias terminal of the differential circuit, the variable bias circuit being operative to generate a variable bias current for application to the differential circuit so as to control an output overshoot of the driver circuit.

2. The driver circuit of claim 1 wherein the optical source comprises a laser diode.

3. The driver circuit of claim 1 wherein the differential circuit comprises an input stage differential pair of the driver circuit.

4. The driver circuit of claim 1 wherein the differential data is generated from a single-ended input data signal.

5. The driver circuit of claim 4 wherein the single-ended input data signal is processed internally to the driver circuit to generate the differential data.

6. The driver circuit of claim 1 wherein the differential data comprises a differential input data signal.

7. The driver circuit of claim 1 further comprising an input stage, an intermediate stage and an output stage, the input stage comprising the differential circuit, the output stage comprising the first and second outputs of the driver circuit.

8. The driver circuit of claim 7 wherein the intermediate stage comprises a push-pull stage having a top portion which is driven by outputs of the input stage and drives the output stage, and a bottom portion which is driven by the differential data.

9. The driver circuit of claim 1 wherein the first and second outputs of the driver circuit are associated with respective collector terminals of corresponding transistors of an output stage differential pair of the driver circuit.

10. The driver circuit of claim 1 wherein the variable bias circuit is configured such that the variable bias current generated thereby is a function of the modulation current.

11. The driver circuit of claim 1 wherein the current generator circuit generates at the bias current output thereof a scaled version of the modulation current, the variable bias circuit being configured to process the scaled version of the modulation current to generate the variable bias current.

12. The driver circuit of claim 1 wherein the differential circuit comprises first and second transistors configured as a differential pair, the first and second inputs of the differential circuit each corresponding to a base terminal of the respective first and second transistors, the bias current being applied to a common emitter terminal of the first and second transistors, a collector terminal of each of the first and second transistors being associated with a signal operative to select a particular one of the first and second outputs of the driver circuit for application of the modulation current thereto.

13. The driver circuit of claim 1 wherein the variable bias circuit is configured to provide a first current path having a first transistor configured to characterize a first output stage transistor of the driver circuit and a second current path having a second transistor configured to characterize a second output stage transistor of the driver circuit, the variable bias circuit being configured such that current through one of the paths is varied in accordance with a differential base-emitter voltage of the output stage, the first and second current paths being configured so as to have a substantially fixed current ratio therebetween.

14. The driver circuit of claim 13 wherein the substantially fixed current ratio comprises an approximately 10:1 current ratio.

15. The driver circuit of claim 1 wherein the variable bias circuit further comprises:
first and second transistors configured to characterize respective first and second output stage transistors of the driver circuit;
first and second current devices, each coupled between a first terminal of a corresponding one of the first and second transistors and a first supply voltage, second and third terminals of the first transistor being coupled to a second supply voltage, a second terminal of the second transistor being coupled to the second supply voltage, and a third terminal of the second transistor being coupled to the second supply voltage via a resistive element;
a differential amplifier having first and second inputs coupled to the first terminals of the respective first and second transistors; and
a third current device having an input terminal coupled to an output terminal of the differential amplifier, the third current device being operative to establish a current through the resistive element such that an output current of the variable bias circuit is variable as a function of a differential emitter-base voltage of the first and second transistors.

16. An integrated circuit comprising:
at least one driver circuit for an optical source, the driver circuit comprising:
a differential circuit having first and second inputs;
a current generator circuit adapted to establish a modulation current for application to one of a first output and a second output of the driver circuit in accordance with differential data applied to the first and second inputs of the differential circuit; and
a variable bias circuit having an input coupled to a bias current output of the current generator circuit and an input coupled to a bias terminal of the differential circuit, the variable bias circuit being operative to generate a variable bias current for application to the differential circuit so as to control an output overshoot of the driver circuit.

17. An apparatus comprising:
an optical source; and
a driver circuit coupled to the optical source, the driver circuit comprising:
a differential circuit having first and second inputs;
a current generator circuit adapted to establish a modulation current for application to one of a first output and a second output of the driver circuit in accordance with differential data applied to the first and second inputs of the differential circuit; and
a variable bias circuit having an input coupled to a bias current output of the current generator circuit and an input coupled to a bias terminal of the differential circuit, the variable bias circuit being operative to generate a variable bias current for application to the differential circuit so as to control an output overshoot of the driver circuit.

* * * * *